US009852962B2

United States Patent
Temmei et al.

(10) Patent No.: US 9,852,962 B2
(45) Date of Patent: Dec. 26, 2017

(54) WATERPROOF ELECTRONIC DEVICE AND MANUFACTURING METHOD THEREOF

(71) Applicant: Hitachi Automotive Systems, Ltd., Hitachinaka-shi, Ibaraki (JP)

(72) Inventors: Hiroyuki Temmei, Tokyo (JP); Mina Amo, Tokyo (JP); Nobutake Tsuyuno, Tokyo (JP); Eiichi Ide, Tokyo (JP); Takeshi Tokuyama, Tokyo (JP); Toshiya Satoh, Hitachinaka (JP); Toshiaki Ishii, Tokyo (JP); Kazuaki Naoe, Tokyo (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/114,431

(22) PCT Filed: Feb. 4, 2015

(86) PCT No.: PCT/JP2015/053124
§ 371 (c)(1),
(2) Date: Jul. 27, 2016

(87) PCT Pub. No.: WO2015/129418
PCT Pub. Date: Sep. 3, 2015

(65) Prior Publication Data
US 2016/0343636 A1 Nov. 24, 2016

(30) Foreign Application Priority Data
Feb. 25, 2014 (JP) .................................. 2014-033952

(51) Int. Cl.
*H01L 23/367* (2006.01)
*H01L 21/288* (2006.01)
(Continued)

(52) U.S. Cl.
CPC ...... *H01L 23/3672* (2013.01); *H01L 21/2885* (2013.01); *H01L 21/565* (2013.01);
(Continued)

(58) Field of Classification Search
None
See application file for complete search history.

(56) References Cited

U.S. PATENT DOCUMENTS 4,601,958 A 7/1986 Levine
4,666,796 A 5/1987 Levine
(Continued)

FOREIGN PATENT DOCUMENTS

JP 61-87892 A 5/1986
JP 2003-31732 A 1/2003
(Continued)

OTHER PUBLICATIONS

International Search Report (PCT/ISA/210) issued in PCT Application No. PCT/JP2015/053124 dated Apr. 28, 2015 with English translation (5 pages).
(Continued)

*Primary Examiner* — Khaja Ahmad
(74) *Attorney, Agent, or Firm* — Crowell & Moring LLP

(57) ABSTRACT

A waterproof electronic device includes: an electronic component module having an electronic component including a semiconductor element, a heat dissipating member provided on the electronic component in a thermally conductive manner, and an insulating material that surrounds the electronic component in such a manner that one surface of the heat dissipating member is exposed; and a waterproof film that is formed at least on whole surfaces in regions of the electronic component module that are to be immersed in a coolant.

10 Claims, 13 Drawing Sheets

(51) Int. Cl.
*H01L 21/56* (2006.01)
*H01L 23/00* (2006.01)
*H01L 23/29* (2006.01)
*H01L 23/31* (2006.01)
*H01L 23/473* (2006.01)
*H05K 5/06* (2006.01)
*H05K 7/20* (2006.01)
*H01L 23/433* (2006.01)
*H01L 23/373* (2006.01)
*H01L 23/495* (2006.01)

(52) U.S. Cl.
CPC ........ *H01L 23/295* (2013.01); *H01L 23/3135* (2013.01); *H01L 23/3735* (2013.01); *H01L 23/3737* (2013.01); *H01L 23/4334* (2013.01); *H01L 23/473* (2013.01); *H01L 23/49541* (2013.01); *H01L 23/49568* (2013.01); *H01L 23/564* (2013.01); *H01L 24/32* (2013.01); *H01L 24/48* (2013.01); *H01L 24/73* (2013.01); *H01L 24/83* (2013.01); *H05K 5/065* (2013.01); *H05K 7/20927* (2013.01); *H01L 23/3107* (2013.01); *H01L 23/49513* (2013.01); *H01L 23/49586* (2013.01); *H01L 24/45* (2013.01); *H01L 2224/32245* (2013.01); *H01L 2224/45124* (2013.01); *H01L 2224/45144* (2013.01); *H01L 2224/48091* (2013.01); *H01L 2224/48106* (2013.01); *H01L 2224/48247* (2013.01); *H01L 2224/73265* (2013.01); *H01L 2924/00014* (2013.01); *H01L 2924/0105* (2013.01); *H01L 2924/01012* (2013.01); *H01L 2924/01013* (2013.01); *H01L 2924/01024* (2013.01); *H01L 2924/01028* (2013.01); *H01L 2924/01029* (2013.01); *H01L 2924/13055* (2013.01); *H01L 2924/17724* (2013.01); *H01L 2924/17747* (2013.01); *H01L 2924/181* (2013.01)

(56) References Cited

U.S. PATENT DOCUMENTS

| | | |
|---|---|---|
| 2004/0061138 A1 | 4/2004 | Shinohara et al. |
| 2005/0063161 A1 | 3/2005 | Yanase et al. |
| 2006/0091512 A1* | 5/2006 | Shinohara ......... H01L 23/49562 257/678 |
| 2007/0087483 A1 | 4/2007 | Yanase et al. |
| 2008/0017999 A1* | 1/2008 | Kikuchi ............. H01L 23/3128 257/787 |
| 2009/0243078 A1* | 10/2009 | Lim .................... H01L 23/4334 257/690 |
| 2011/0318884 A1 | 12/2011 | Noritake et al. |

FOREIGN PATENT DOCUMENTS

| | | |
|---|---|---|
| JP | 2003-309224 A | 10/2003 |
| JP | 2004-119667 A | 4/2004 |
| JP | 2005-93781 A | 4/2005 |
| JP | 2008-270294 A | 11/2008 |
| JP | 2009-277768 A | 11/2009 |
| JP | 2012-9569 A | 1/2012 |
| JP | 2014-187072 A | 10/2014 |

OTHER PUBLICATIONS

Japanese-language Written Opinion (PCT/ISA/237) issued in PCT Application No. PCT/JP2015/053124 dated Apr. 28, 2015 (6 pages).

* cited by examiner

WATERPROOF ELECTRONIC DEVICE AND MANUFACTURING METHOD THEREOF

TECHNICAL FIELD

The present invention relates to a waterproof electronic device and a manufacturing method thereof.

BACKGROUND ART

Electronic devices as power converters for driving motors are mounted on hybrid motor vehicles or electric motor vehicles. An electronic device such as a power converter converts direct current power supplied from a battery into alternating current power in order to drive a motor and, in a reverse manner, convert alternating current power regenerated by the motor into direct current power in order to charge an electrical storage device. In this type of electronic devices, semiconductor elements that generate heat at a high temperature are accommodated in a case. It is therefore necessary to immerse and cool the electronic devices in cooling medium such as cooling water.

As one example of waterproof electronic devices, a structure is known in which a semiconductor device accommodating semiconductor elements is provided with heat dissipating fins and fixed to a case by sandwiching the device from above and below, respectively with an upper wall part of the case body and a bottom plate of the case. In this waterproof electronic device, a space defined by a side surface of the semiconductor device and an inner wall of the case forms a flow path for cooling of the semiconductor device, and the semiconductor device is immersed in the coolant (see PTL 1).

CITATION LIST

Patent Literature

PTL1: Japanese Laid-Open Patent Publication No. 2004-119667

SUMMARY OF INVENTION

Technical Problem

With the above-described electronic device, a cooling efficiency can be improved because the semiconductor device provided with the heat dissipating fins is immersed in the flow path so that the side surface of the semiconductor device is cooled by the coolant. However, because the case accommodating semiconductor elements therein is required to form a structure that is sealed from the outside, the material cost is high and the productivity is low because of a large number of assembly steps.

Solution to Problem

A waterproof electronic device according to a first aspect of the present invention comprises: an electronic component module having an electronic component including a semiconductor element, a heat dissipating member provided on the electronic component in a thermally conductive manner, and an insulating material that surrounds the electronic component in such a manner that one surface of the heat dissipating member is exposed; and a waterproof film that is formed at least on whole surfaces in regions of the electronic component module that are to be immersed in a coolant.

According to a second aspect of the present invention, in a method for manufacturing a waterproof electronic device, an electronic component is mounted including a semiconductor element on a lead frame and bonding electrodes of the semiconductor element and leads of the lead frame; a heat dissipating member is provided on the lead frame in a thermally conductive manner; an electronic component module is formed by covering the electronic component and the heat dissipating member with an insulating material in such a manner that a part of the leads of the lead frame extends to outside; and a waterproof film is formed on an outer surface of the heat dissipating member of the electronic component module and at least parts of the insulating material around the heat dissipating member.

Advantages Effects of Invention

According to the present invention, a case accommodating the whole electronic component module is not necessary because a waterproof film is formed on outer surfaces of the electronic component module. Thus, a reduction in material cost and an improvement in productivity can be achieved.

BRIEF DESCRIPTION OF DRAWINGS

FIG. 6A is a cross-sectional view and FIG. 6B is a plan view seen from above.

DESCRIPTION OF EMBODIMENTS

First Embodiment

Figure 1:
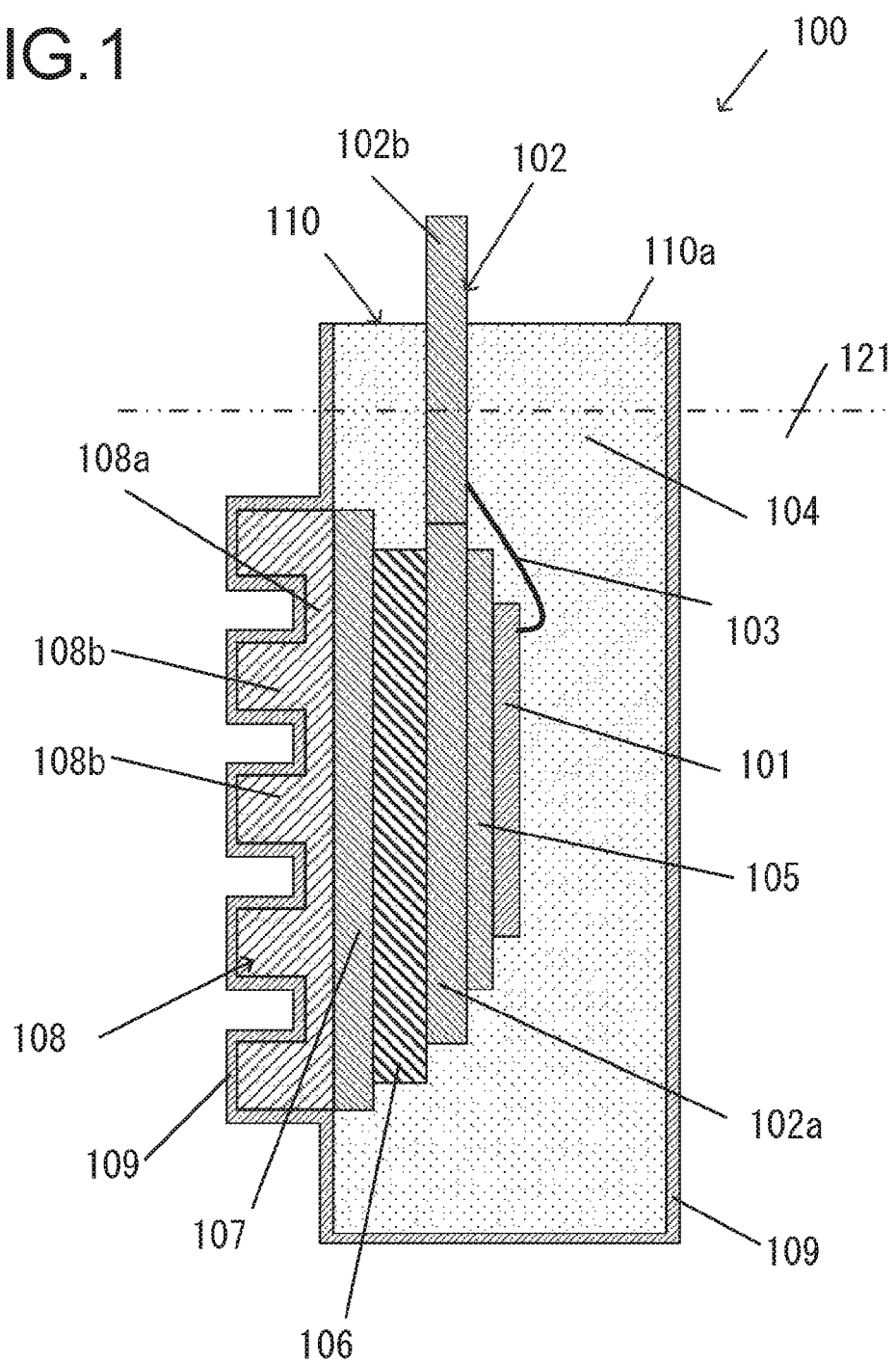
FIG. 1 is a cross-sectional view of a waterproof electronic device according to one embodiment of the present invention.

One embodiment of a waterproof electronic device and a manufacturing method thereof according to the present invention will now be described referring to the drawings.

(Structure of Waterproof Electronic Device 100)

Figure 2:
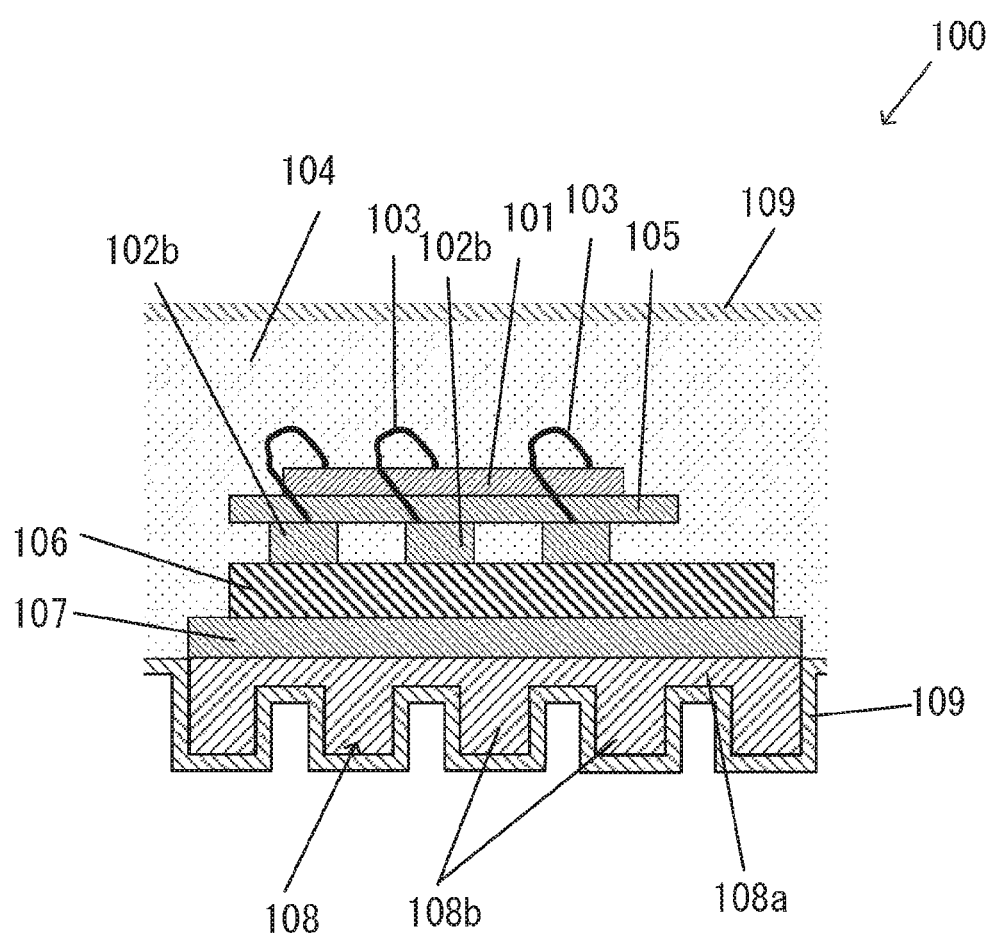
FIG. 2 is an internal cross-sectional view of the waterproof electronic device shown in FIG. 1, seen from above.

FIG. 1 is a cross-sectional view of a waterproof electronic device as one embodiment of the present invention and FIG. 2 is an internal cross-sectional view of the waterproof electronic device shown in FIG. 1, as seen from above.

For example, the waterproof electronic device 100 is mounted on a hybrid vehicle or an electric vehicle and used as a power converter for driving motors and the like.

The waterproof electronic device 100 includes an electronic component module 110 (described hereinafter in detail) and a waterproof film 109 which is formed on peripheral side surfaces and a bottom surface of the electronic component module 110. The electronic component module 110 includes members such as an electronic component 101 which is mounted on a lead frame 102, an insulating material 104 made of an organic resin which surrounds the electronic component 101 and the lead frame 102, and a heat dissipating member 108 which is exposed on one surface.

The waterproof film 109 is not formed on an upper surface 110a of the electronic component module 110 and the insulating material 104 is exposed there. The waterproof electronic device 100 is immersed, up to the top of the heat dissipating member 108, in a coolant 121 such as a cooling water flowing through a cooling flow path of a cooling module (not shown) as shown by a dashed double-dotted line in FIG. 1. Thus, the waterproof electronic device 100 is cooled by the coolant 121.

The electronic component module 110 includes the electronic component 101, a joining material 105, the lead frame 102, an insulating member 106, an intermediate heat transfer member 107, and the heat dissipating member 108.

The electronic component 101 is constructed of semiconductor elements that cope with large electric power, such as Insulated Gate Bipolar Transistors (IGBTs). Electronic devices such as electric power converters are required to be able to cope with large electric power because they are used for inverters of motor vehicles. Therefore, power IGBTs that generate a large amount of heat during operation are used for the electronic component 101.

A back surface of the electronic component 101 is joined to the lead frame 102 with the joining material 105 such as a solder. The lead frame 102 is made of copper, aluminum, or an alloy having copper or aluminum as a main component and has a die 102a on which the electronic component 101 is mounted and a plurality of leads 102b. Electrodes (not shown) are formed on a main surface of the electronic component 101 and bonded to respective leads 102b with wires 103 made of aluminum, gold, or other materials.

The intermediate heat transfer member 107 is a planar plate-like member made of a metal such as aluminum, copper, or magnesium. The insulating member 106 is placed between the die 102a of the lead frame 102 and the intermediate heat transfer member 107 and is made of a ceramic or an organic resin.

The heat dissipating member 108 is constructed of a plate-like body 108a and a plurality of cooling fins 108b which are arranged in a matrix manner or in a staggered manner and integrally formed with the plate-like body 108a. The heat dissipating member 108 is made of a metal including aluminum, copper, magnesium or the like, or ceramics or a mixture of metals and inorganic materials having a high thermal conductivity, for example. As one example of methods of efficiently forming the heat dissipating member 108, machining such as slicing or dicing may be applied. The heat dissipating member 108 is formed by preparing a plate material having a thickness equivalent to a total thickness of the body 108a and the cooling fins 108b and forming grooves in the plate material at predetermined intervals in up-and-down and right-and-left directions, the grooves having a depth equivalent to the thickness of the cooling fins 108. In machining the grooves, machining may be performed in the up-and-down direction and in the right-and-left direction which are orthogonal to one another or which are at an angle to each other. The grooves may be formed by methods other than machining. A clad material may be used wherein materials are different for the body 108a and the cooling fins 108b.

The insulating material 104 is made of an epoxy resin, or an organic resin material containing an epoxy resin and a filler mixed in the epoxy resin, the filler being made of a material having a larger thermal conductivity than that of silica.

The waterproof film 109 is made of a metal such as aluminum, nickel, tin, or chromium, or a resin having a high water resistance, such as Teflon (registered trademark). The waterproof film 109 is formed on all of the peripheral side surfaces and bottom surface of the insulating material 104 that are exposed from the heat dissipating member 108, as well as an outer surface of the heat dissipating member 108. A method for forming the waterproof film 109 will be described hereinafter.

(Method for Manufacturing Waterproof Electronic Device 100)

One embodiment of a method for manufacturing the waterproof electronic device 100 will now be described referring to FIGS. 3(a) to 3(d).

Figure 3A:
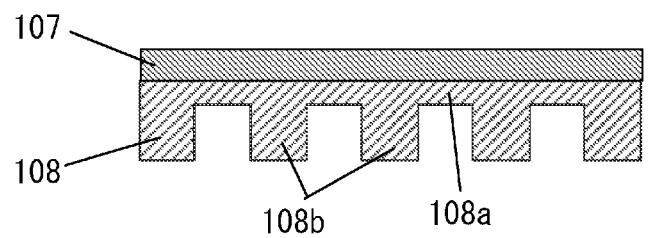
FIGS. 3A-3D are cross-sectional views in method steps for explaining a method for manufacturing the waterproof electronic device in FIG. 1.

As shown in FIG. 3(a), the intermediate heat transfer member 107 is joined to the heat dissipating member 108. Welding, soldering, brazing, friction stir welding or the like may be used as the joining method. Although the heat dissipating member 108 may be made of a ceramic, it is also possible that the body 108a is made of a metal material and only the cooling fins 108b are made of a ceramic.

Figure 3B:
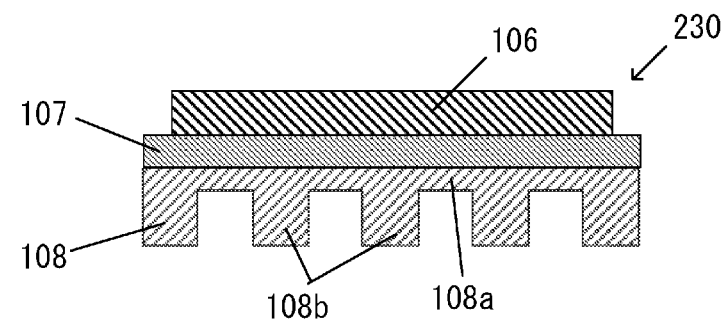

As shown in FIG. 3(b), the insulating member 106 is joined onto the intermediate heat transfer member 107 to form a heat dissipating module 230 in which the heat dissipating member 108, the intermediate heat transfer member 107, and the insulating member 106 are joined together.

If the insulating member 106 is made of a resin, it is desirable to use a resin having a high thermal conductivity. The resin, which is adhesive and has not yet completely hardened, is placed and hardened on the intermediate heat transfer member 107.

If the insulating member 106 is made of a ceramic, the insulating member 106 is joined to the intermediate heat transfer member 107 by welding, soldering, friction stir welding or the like, or with a resin having a high thermal conductivity inserted between the member 106 and the intermediate heat transfer member 107.

Figure 3C:
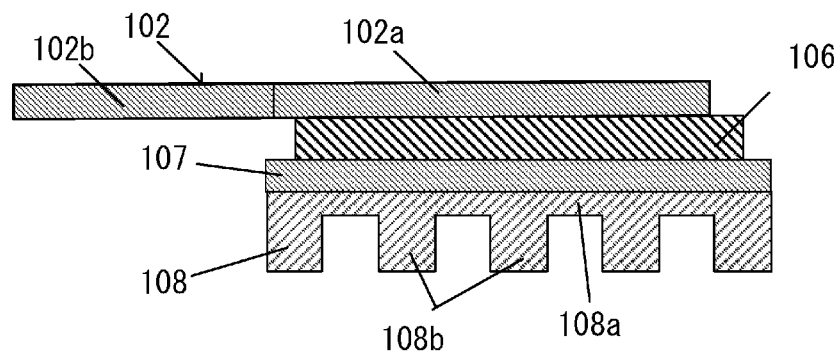

As shown in FIG. 3(c), the lead frame 102 is joined to the insulating member 106 of the heat dissipating module 230.

The joining method may be the some as the method for joining the intermediate heat transfer member 107 and the insulating member 106.

Figure 3D:
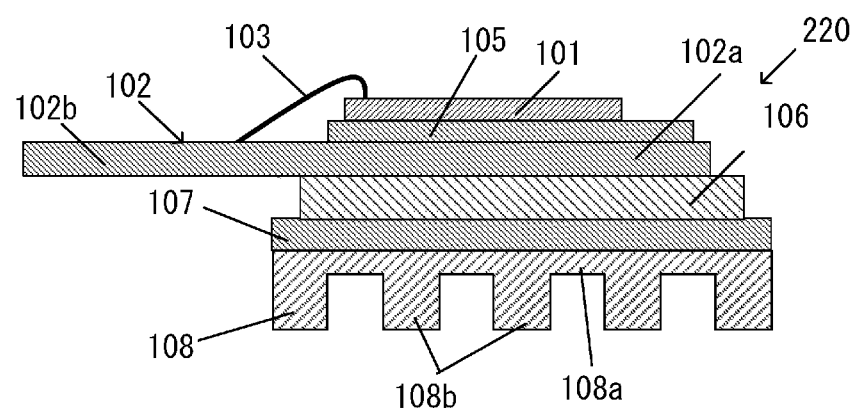

As shown in FIG. 3(d), the back surface of the electronic component 101 is die-bonded with the joining material 105. Although a soldering method with a solder as the joining material 105 is desirable, other methods may be used. Then, the electronic component 101, specifically the electrodes (not shown) of the semiconductor elements, and the leads 102b of the lead frame 102 are connected with the wires 103 by wire bonding. In this way, an intermediate module 220 shown in FIG. 3(d) is formed.

The intermediate module 220 in the state in FIG. 3(d) is sealed with the insulating material 104 in such a manner that at least the cooling fins 108b of the heat dissipating member 108 are exposed, in order to form the electronic component module 110 shown in FIG. 1. It is preferable to form the electronic component module 110 by molding with an epoxy resin or the like as the insulating material 104.

Then, the waterproof film 109 is formed on outer surfaces of the electronic component module 110. The waterproof film 109 is formed on the outer surface of the heat dissipating member 108 and the surfaces of the insulating material 104. It will be noted that the waterproof film 109 is not formed on the upper surface 110a of the electronic component module 110 and the insulating material 104 is exposed there. In this way, the waterproof electronic device 100 shown in FIG. 1 is created.

Teflon (registered trademark) or metals may be used as a material of the waterproof film 109, as described above. Teflon (registered trademark) has an advantage of low price, while metals are superior to the Teflon (registered trademark) in thermal conductivity and durability.

If a metal material is used for the waterproof film 109, it is preferable to use a material having a smaller ionization tendency than that of hydrogen in terms of corrosion resistance. From another point of view, the corrosion of the waterproof film 109 itself can be prevented if a dense oxidation film is formed on the surface of the film. For this reason, aluminum, nickel, tin, chromium, or other materials having such a characteristic may be used.

Possible methods of forming the waterproof film 109 include sputtering, vapor deposition, electroless plating, cold spraying, thermal spraying, or aerosol deposition, or combined in methods of power supply thin film formation by one of the above-described methods and electroplating. Among others, a combined method of the cold spraying or power supply thin film formation and the electroplating is preferable because a thick film can be efficiently formed.

If the combined method of the power supply thin film formation and the electroplating is used, it is possible to use an electrically conductive polymer film formation as the power supply thin film formation, in addition to the aforementioned methods. Electroless plating, aerosol deposition, and electrically conductive polymer film formation are preferable in view of adhesion, cost, damage to the insulating material 104, and other considerations. Copper, nickel, tin, zinc, or an alloy including one or more of them may be used as a metal material in forming a thick film on the power supply thin film by electroplating. Among these materials, nickel is superior in corrosion resistance, while copper is superior in thermal conductivity.

(Another Method of Manufacturing Waterproof Electronic Device 100)

One example of other methods of manufacturing the waterproof electronic device 100 will be described referring to FIGS. 4(a) to 4(e). A manufacturing method as explained below is characterized by its high efficiency, especially because the insulating member 106, the intermediate heat transfer member 107, and the heat dissipating member 108 can be integrally formed without special joining steps.

Figure 4A:
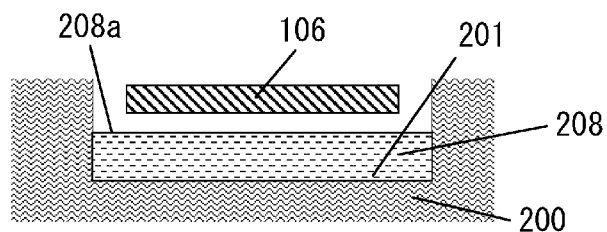
FIGS. 4A-4E are cross-sectional views corresponding to steps of one example of methods for manufacturing a heat dissipating member and an intermediate heat transfer member.

(1) Reference is Made to FIG. 4(a):

A mold 200 having a cavity 201 is prepared wherein the cavity 201 has a larger depth than the total thickness of the heat dissipating member 108 and the intermediate heat transfer member 107. The mold 200 is required to be made of a material that has a high melting point not less than a melting temperature of the intermediate heat transfer member 107 as explained in the next step and can be separated from the solidified intermediate heat transfer member 107. Materials that satisfy these requirements may include ceramics such as alumina, for example.

The cavity 201 of the mold 200 is filled with a high thermal conductivity material 208, which becomes the heat dissipating member 108 later, up to a slightly lower level than the thickness of the heat dissipating member 108 (including the thickness of the cooling fins 108b). The high thermal conductivity material 208 used here is in a powder form and has a higher thermal conductivity than that of metals in the normal bulk state, such as magnesium oxide, silica, alumina, boron nitride, aluminum nitride, or carbon powders. Among others, carbon powder is preferable because of its reasonable cost and superior proccessability. The reason for the requirement of proccessability will be described hereinafter. Then, the insulating member 106 is arranged with a spacing from an upper surface 208a of the high thermal conductivity material 208. The spacing between the upper surface 208a of the high thermal conductivity material 208 and the insulating member 106 is equivalent to the thickness of the intermediate heat transfer member 107.

Figure 4B:
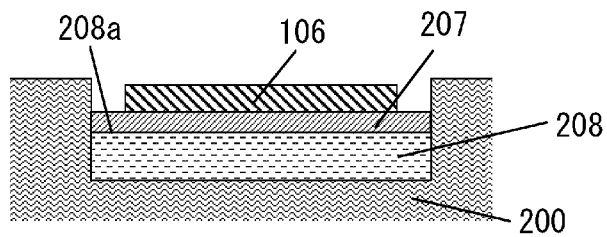

(2) Reference is Made to FIG. 4(b):

A low melting point metal material 207, which becomes the intermediate heat transfer member 107 later, is injected between the high thermal conductivity material 208 and the insulating member 106. The low melting point metal material 207 is a metal material having a lower melting point than that of the high thermal conductivity material 208. The injection of the low melting point metal material 207 is ended at a point of time when the low melting point metal material 207 reaches the lower surface of the insulating member 106.

Figure 4C:
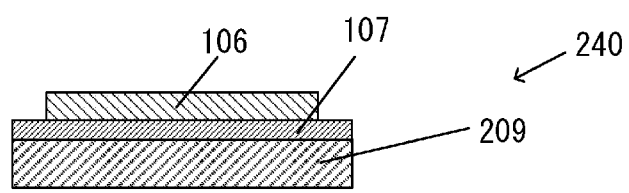

By injecting the low melting point metal material 207 in a molten state, the high thermal conductivity material 208 becomes a high thermal conductivity/low melting point metal composite material 209 with the low melting point metal material 207 mixed therein (see FIG. 4(c)). Furthermore, the low melting point metal material 207 on the surface side near the insulating member 106 becomes the intermediate heat transfer member 107 (see FIG. 4(c)) that join the high thermal conductivity/low melting point metal composite material 209 to the insulating member 106. In this way, an unprocessed heat dissipating module 240 is constructed in which the high thermal conductivity/low melting point metal composite material 209, the intermediate heat transfer member 107, and the insulating member 106 are integrated together.

(3) Reference is Made to FIG. 4(c):

The unprocessed heat dissipating module 240 in which the high thermal conductivity/low melting point metal composite material 209, the intermediate heat transfer member 107, and the insulating member 106 are integrated together is removed from the mold 200.

Figure 4D:
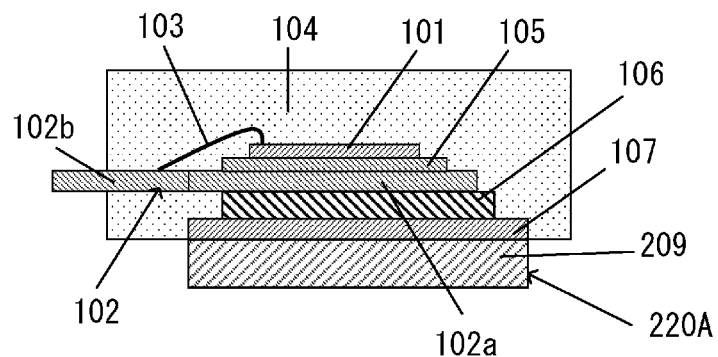
Figure 4E:
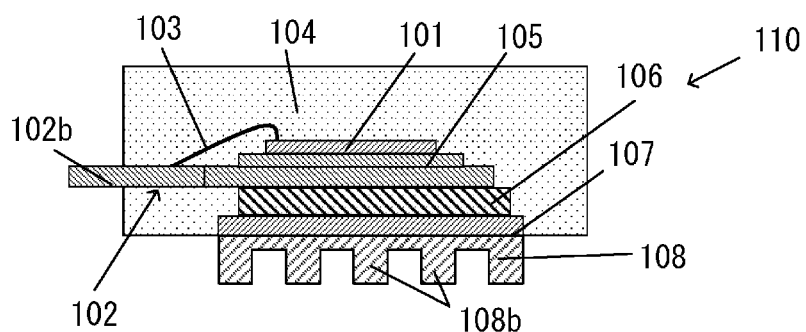

(4) Reference is Made to FIG. 4(d):

As in the case of the first embodiment, the lead frame 102 is joined to the insulating member 106 of the unprocessed heat dissipating module 240 and the back surface of the electronic component 101 is die-bonded with the joining material 105. Furthermore, the electrodes (not shown) of the electronic component 101 and the leads 102b of the lead frame 102 are connected with the wires 103 by wire bonding to form an intermediate module 220A.

The intermediate module 220A is then sealed with the insulating material 104 in such a manner that the high thermal conductivity/low melting point metal composite material 209 is exposed. Also in this case, it is preferable to employ molding with an epoxy resin or the like as the insulating material 104.

(5) Reference is Made to FIG. 4(*e*):

A plurality of cooling fins 108*b* is formed by machining the high thermal conductivity/low melting point metal composite material 209. Thus, the high thermal conductivity/low melting point metal composite material 209 becomes the heat dissipating member 108 having the plurality of cooling fins 108*b*. Here, if the high thermal conductivity material 208 is made of a material that is easy to process, the efficiency of processing to form the plurality of cooling fins 108*b* can be improved. In this way, the electronic component module 110 similar to that in the first embodiment is formed.

(6) Thereafter, the waterproof film 109 is formed on the outer surfaces of the electronic component module 110, as in the first embodiment. In this way, the waterproof electronic device 100 shown in FIG. 1 is obtained.

According to this method, a high thermal conductivity material, such as magnesium oxide, silica, alumina, boron nitride, aluminum nitride, or carbon powders, can be used so that a heat dissipation performance of the heat dissipating member 108 can be improved.

In the example described above, the method involves putting e high thermal conductivity material 208 in the mold 200 and thereafter injecting the low melting point metal material 207 into the mold to form the high thermal conductivity/low melting point metal composite material 209. Instead, it is also possible to prepare the high thermal conductivity/low melting point metal composite material 209 made of a mixture of a high thermal conductivity material and a low melting point metal material, and then to put the high thermal conductivity/low melting point metal composite material 209 into the mold 200.

Furthermore, in the example described above, the method involves forming the cooling fins 108*b* of the heat dissipating member 108 by machining after the intermediate module 220A is formed. Instead, it is also possible to form protrusions corresponding to the plurality of cooling fins 108*b* in the cavity 201 of the mold 200, before the high thermal conductivity material 208 is put into the cavity 201. Because the heat dissipating member 108 having the plurality of cooling fins 108 is formed in the cavity 201 of the mold 200 by injecting the low melting point metal material 207, this method is more efficient than the method in which the high thermal conductivity/low melting point metal composite material 209 is processed to form the cooling fins 108*b* in a later process step.

(Another Method for Forming Waterproof Film 109)

The first embodiment described above illustrates the structure in which no waterproof film 109 is provided on the whole upper surface 110*a* of the electronic component module 110. Instead, the waterproof film 109 may be formed on the upper surface 110*a* of the electronic component module 110 to reach the vicinity of the periphery of the leads 102*b* so that a waterproof region is extended in order to improve water resistance.

The method will be described referring to FIGS. 5, 6(*a*) and 6(*b*).

Figure 5:
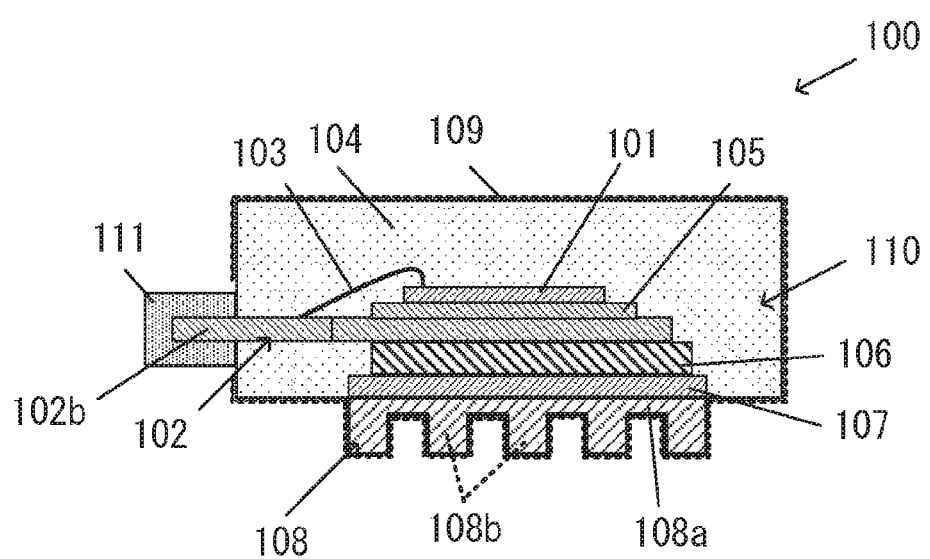
FIG. 5 is a cross-sectional view showing one example of methods for forming a waterproof film.

As shown in FIG. 5, parts of the leads 102*b* of the electronic component module 110 that project from the insulating material 104 are covered by a resist 111. In this state, the waterproof film 109 is formed on all surfaces of the insulating material 104 of the electronic component module 110. The method of forming the waterproof film 109 is the same as described above.

After the waterproof film 109 is formed, the resist 111 is peeled off. This state is shown in a cross-sectional view of FIG. 6(*a*) and a plan view of FIG. 6(*b*) seen from above. Although the waterproof film 109 is formed also on the upper surface 110*a* of the electronic component module 110, the waterproof film 109 is not formed on the periphery of each lead 102*b* and is not contact with the lead 102*b*. The waterproof electronic device 100 is used in such a manner that the upper surface 110*a* of the electronic component module 110 is not immersed in the coolant 121, as shown in FIG. 1. However, insulation failures can occur due to dirt adhered to the periphery of each lead 102*b*. Hence, if the above-described structure is employed, it is necessary to define the periphery where the waterproof film 109 is not formed on the upper surface 110*a*, in order to prevent a short circuit of each lead 102 due to adhesion of dirt.

It will be noted that the leads 102*b* may be surrounded and reinforced by a resin or the like in order to increase the strength of interfaces between the leads 102 and the insulating material 104. Thus, the insulation failures due to adhesion of dirt described above can also be prevented.

(Variation of Heat Dissipating Module 230)

Figure 7A:
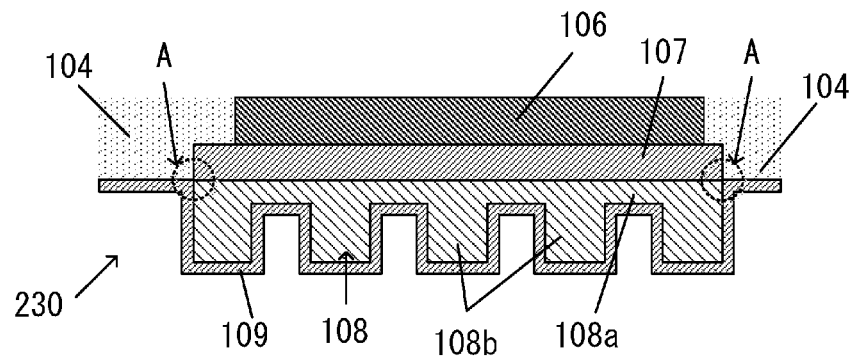
FIGS. 7A-7C are enlarged cross-sectional views of a heat dissipating module.

FIGS. 7(*d*) to 7(*c*) are enlarged cross-sectional views of a heat dissipating module.

FIG. 7(*a*) is an enlarged cross-sectional view of the heat dissipating module 230 shown in FIG. 3.

The heat dissipating module 230 is constructed of the heat dissipating member 108, the intermediate heat transfer member 107, and the insulating member 106 which are integrally joined. The insulating member 106 has a smaller area than those of the heat dissipating member 108 and the intermediate heat transfer member 107.

In the heat dissipating module 230 shown in FIG. 7(*a*), the heat dissipating member 108 and the intermediate heat transfer member 107 have the same shape and the same size in a plan view, and four members, i.e., the heat dissipating member 108, the intermediate heat transfer member 107, the insulating material 104, and the waterproof film 109 meet together in an area A. A stress concentration can occur at a position where a number of members made of different materials meet together.

A heat dissipating module 230A shown in FIG. 7(*b*) has a structure in which an outer shape of the intermediate heat transfer member 107 is larger than that of the heat dissipating member 108. In this structure, three members, i.e., the heat dissipating member 108, the intermediate heat transfer member 107, and the waterproof film 109, but not the insulating material 104, meet together in the area A. Because the number of the members that meet together is smaller in the structure in FIG. 7(*b*), the stress concentration in the area A can be smaller compared with that in the structure in FIG. 7(*a*).

A heat dissipating module 230B shown in FIG. 7(*c*) has the same structure as that of the heat dissipating module 230 shown in FIG. 7(*a*) and four members meet together in the area A. However, in the heat dissipating module 230B, the heat dissipating member 108 and the intermediate heat transfer member 107A are made of the same material. In other words, the number of different materials that meet together in the area A is three in the heat dissipating module 230B. For this reason, the stress concentration can be smaller compared with that in the structure in which four different materials meet together in the area A.

According to the embodiment described above, the following advantageous effects can be obtained.

(1) The electronic component module 110 in this embodiment includes the insulating material 104 which covers one surface side of the electronic component 101 that is a semiconductor element, and the heat dissipating member 108 on the other surface side of the electronic component 101. The waterproof film 109 is provided on regions of the surfaces of the heat dissipating member 108 and the insulating material 104 that are to be immersed in the coolant 121, in order to make the regions waterproof. For this reason, a metal case accommodating the whole electronic component module 110 is not necessary. Therefore, an reduction in material cost and an improvement in productivity can be achieved.

(2) The heat dissipating member 108, the intermediate heat transfer member 107, and the insulating member 106 are integrated by joining to form the heat dissipating module 230. The intermediate module 220 is formed by joining the lead frame 102 to insulating member 106 of the heat dissipating module 230, joining the electronic component 101 onto the lead frame 102 with the joining material 105, and bonding the electrodes of the electronic component 101 and the leads 102b of the lead frame 102 with the wires 103. Because the intermediate module 220 has such a simplified structure, assembly tasks are easy and the productivity is high.

(3) The electronic component module 110 is a primary sealed body in which simply the intermediate module 220 is sealed with the insulating material 104 and no secondary sealing is necessary. Also this fact contributes to an improvement in productivity.

(4) In the structure in this embodiment, the surfaces of the insulating material 104, together with the outer surface of the cooling fins 108b of the heat dissipating member 108, are covered with the waterproof film 109 and there is no seam of the waterproof film 109 in the regions that are to be immersed in the coolant 121. In this way, the structure can have a high pressure resistance.

Figure 7B:
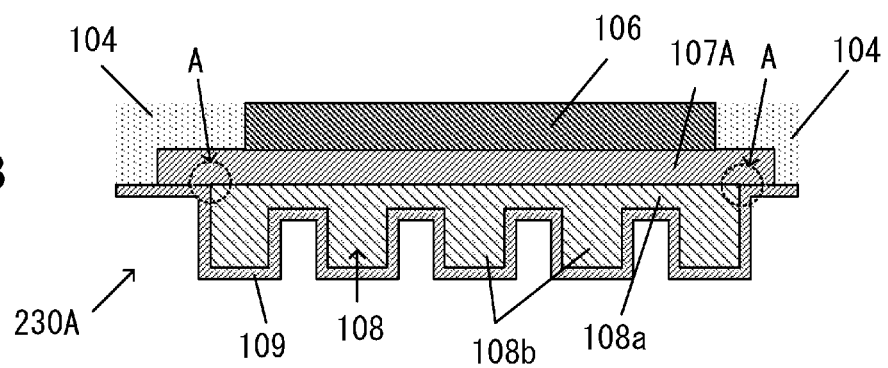

(5) With the heat dissipating module 230A having a structure in which the area of the intermediate heat transfer member 107 is larger than that of the heat dissipating member 108 as shown in FIG. 7(b), the stress concentration can be smaller compared with that in the radiator module 230 having a structure in which four members, i.e., the heat dissipating member 108, the intermediate heat transfer member 107, the insulating material 104, and the waterproof film 109 meet together.

Figure 7C:
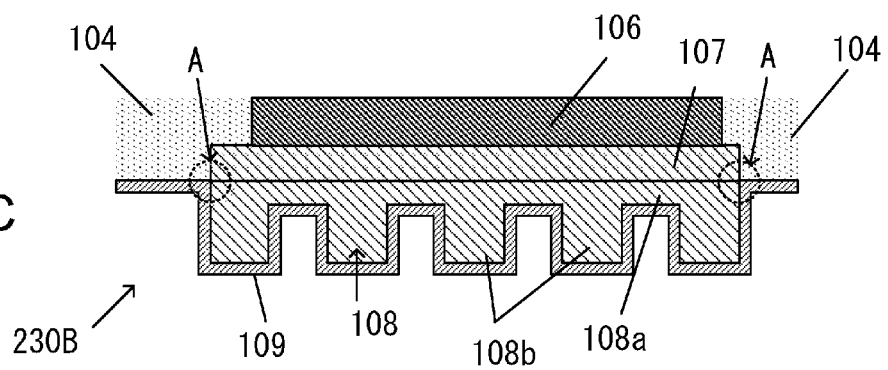

(6) With the heat dissipating module 230B having a structure in which the heat dissipating member 108 and the intermediate heat transfer member 107 are made of the same material as shown in FIG. 7(c), the stress concentration can be smaller compared with that in the case where the members are made of different materials, even in the structure in which four materials, i.e., the heat dissipating member 108, the intermediate heat transfer member 107, the insulating material 104, and the waterproof film 109 meet together.

(7) In the case where the high thermal conductivity material 208 in a powder form is put in the mold 200 and the low melting point metal material 207 is then injected into a gap between the high thermal conductivity material 208 and the insulating member 106 to form the heat dissipating module having the high thermal conductivity/low melting point metal composite material 209 as shown in FIG. 4, the heat dissipating member 108 having a large thermal conductivity can thereby be obtained. Furthermore, it is possible to improve an efficiency of a task of joining the high thermal conductivity/low melting point metal composite material 209, the intermediate heat transfer member 107, and the insulating member 106.

Figure 6A:
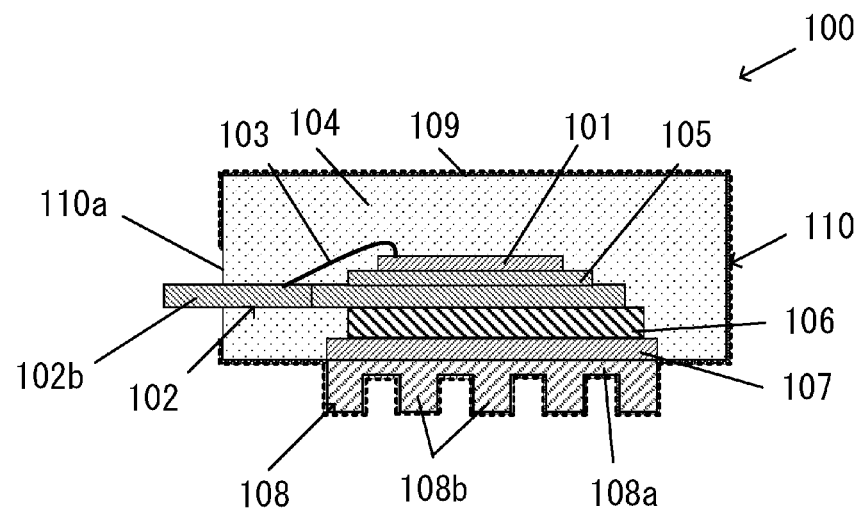
FIGS. 6A and 6B are views for explaining a step subsequent to a step in FIG. 5.
Figure 6B:
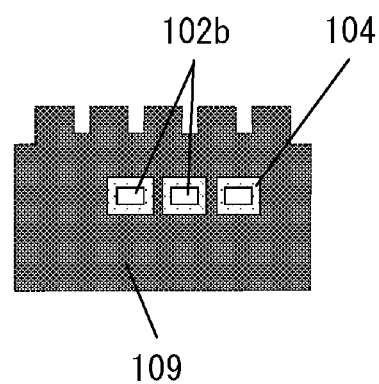

(8) As shown in FIGS. 5 and 6, the structure may be employed in which the waterproof film 109 is formed on the upper surface 110a of the electronic component module 110 to reach the vicinity of the periphery of the leads 102b so that a waterproof region is extended. In this case, surrounding and reinforcing each lead 102b by a resin or the like can prevent insulation failures that could occur due to adhesion of dirt on the periphery of the leads 102b.

Second Embodiment

Figure 8:
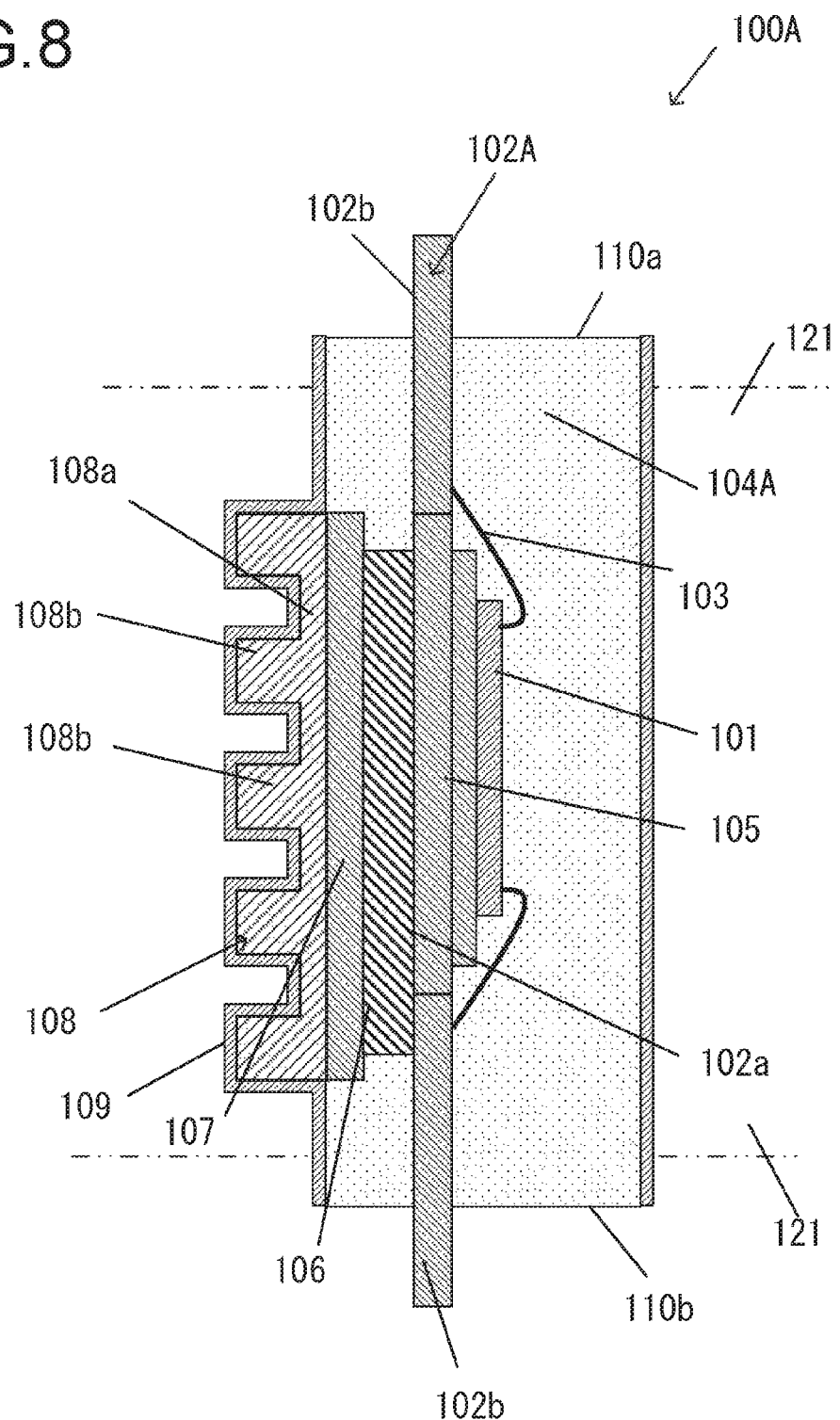
FIG. 8 is a cross-sectional view of a waterproof electronic device showing a second embodiment of the present invention.

FIG. 8 is a cross-sectional view of a waterproof electronic device 100A according to a second embodiment of the present invention.

The waterproof electronic device 100A in the second embodiment is used in a state in which upper and lower ends of the waterproof electronic device 100A project out of the cooling flow path through which the coolant 121 flows, in other words, in a state in which only a center region of the waterproof type electronic device 100A is immersed in the coolant 121.

The upper surface 110a and a lower surface 110b of the electronic component module 110A are arranged outside of the cooling flow path through which the coolant 121 flows. A waterproof film 109 is not formed on the upper and lower surfaces 110a, 110b and an insulating material 104A is exposed there. In other words, in the waterproof electronic device 100A, the waterproof film 109 is formed on the whole peripheral side surfaces, but not on the upper surface 110a and the lower surface 110b. The lead frame 102A has leads 102b that respectively extend in up and down directions from a die 102 in the center part. Each of the leads 102b that extend in up and down directions is bonded to an electrode of the electronic component 101 by a wire 103 and a tip end side of each lead 102b is extended out of the insulating material 104A.

In other respects, the configuration of the waterproof electronic device 100A is the same as that in the first embodiment. Members corresponding to those in the first embodiment are denoted by the same reference numerals and the explanation thereof will be omitted.

It will be noted that also in the second embodiment, the waterproof film 109 may be formed on the upper surface 110a and/or the lower surface 110b of the electronic component module 110A in such a manner that the waterproof film 109 is not in contact with the leads 102b, as shown in FIG. 6.

Moreover, the structure of the unprocessed heat dissipating module 240 and the manufacturing method for forming the unprocessed heat dissipating module 240 shown in FIGS. 4(a) to 4(c) may be applied. Furthermore, the structure of the heat dissipating module 230A shown in FIG. 7(b) or the heat dissipating module 230B shown in FIG. 7(c) may be employed. Therefore, the same effects as those in the first embodiment can be obtained also in the second embodiment.

Third Embodiment

Figure 9:
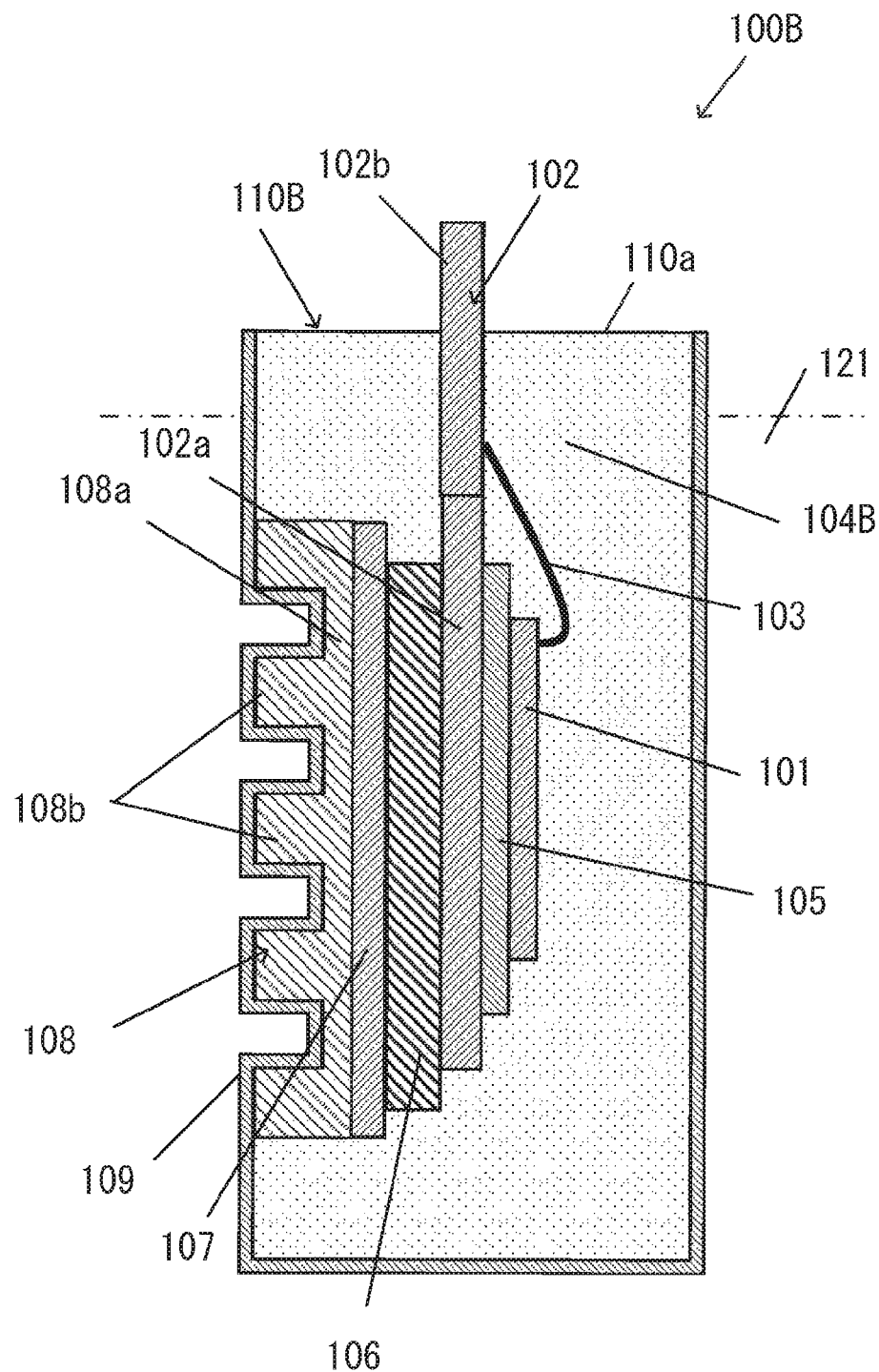
FIG. 9 is a cross-sectional view of a waterproof electronic device showing a third embodiment of the present invention.

FIG. 9 is a cross-sectional view of a waterproof electronic device 1003 according to a third embodiment of the present invention.

The waterproof electronic device 100B in the third embodiment is different from the waterproof electronic device 100 in the first embodiment in that an insulating material 104B of an electronic component module 110B is formed to have a thickness with which it is flush with upper surfaces (left side surfaces in FIG. 9) of the cooling fins 108*b* of the heat dissipating member 108.

In other words, as shown in FIG. 9, in the waterproof electronic device 100B, a distance between a side surface of the waterproof electronic device 100B on the main surface side of the electronic component 101, i.e., a right side surface of the waterproof electronic device 100B and the main surface of the electronic component 101 is the same as that in the waterproof electronic device 100 in the first embodiment. However, a distance between aside surface opposite to the right side surface, i.e., a left side surface of the waterproof electronic device 100B and the main surface of the electronic component 101 is larger than that in the waterproof electronic device 100 in the first embodiment. Specifically, the left side surface of the waterproof electronic device 100B is formed to be flush with the upper surfaces of the cooling fins 108*b* of the heat dissipating member 108. Therefore, the waterproof electronic device 100B is thicker than the waterproof electronic device 100 by a height of the cooling fins 108*b*.

For this reason, the waterproof electronic device 100B in the third embodiment can have a larger strength than those of the waterproof electronic device 100 in the first embodiment and the waterproof electronic device 100A in the second embodiment 2. The waterproof electronic device 100B is therefore suitable for cases where a reduction in thickness is required.

Figure 10A:
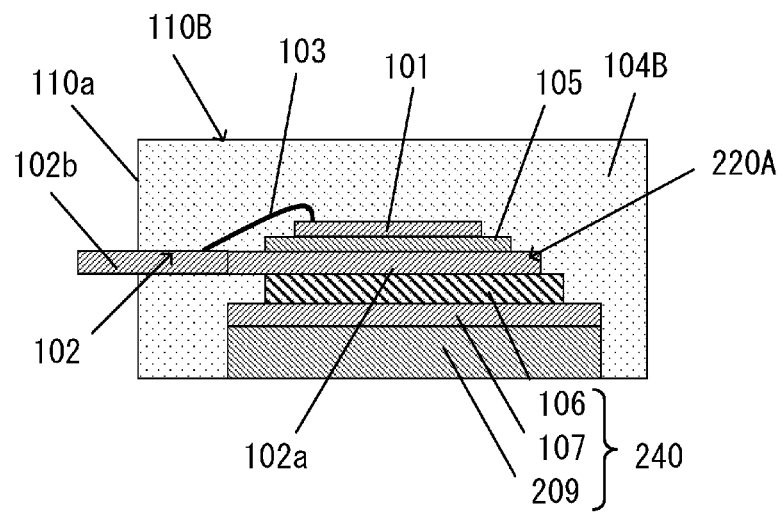
FIGS. 10A and 10B are cross-sectional views for explaining a method for manufacturing the waterproof electronic device shown in FIG. 9.
Figure 10B:
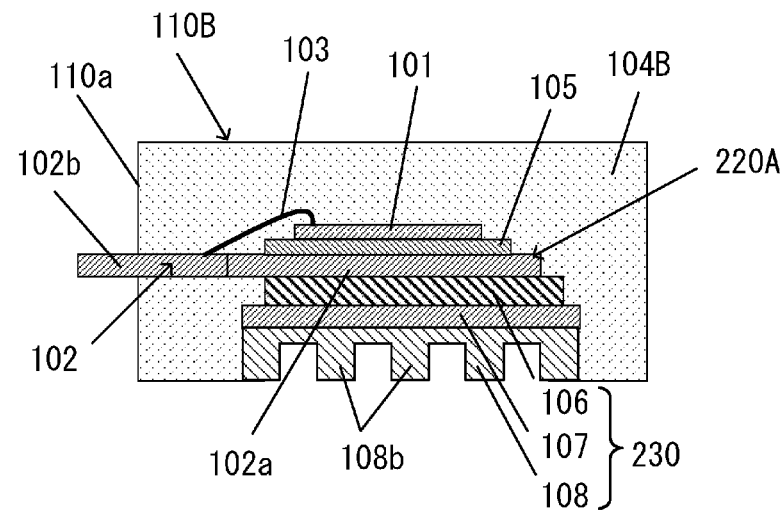

FIGS. 10(*a*) and 10(*b*) are cross-sectional views for explaining a method for manufacturing the waterproof electronic device 100B in the third embodiment.

By the method shown in FIGS. 4(*a*) to 4(*c*), the unprocessed heat dissipating module 240 is formed, the lead frame 102 is joined to the unprocessed heat dissipating module 240, and the electronic component 101 is bonded to the lead frame 102 with the joining material 105. Furthermore, the electrodes (not shown) of the electronic component 101 and the leads 102*b* of the lead frame 102 are connected with the wires 103 by wire bonding to form the intermediate module 220A. In the above process, the unprocessed heat dissipating module 240 may be formed in accordance with the method in the first embodiment. In other words, the intermediate heat transfer member 107 is joined to a plate-like cooling member on which the cooling fins 108*b* have not yet been formed, by welding, soldering, brazing, friction stir welding or the like, and an unhardened insulating member 106 is then mounted and hardened on the intermediate heat transfer member 107.

Then, by molding or the like, the intermediate module 220A is covered with the insulating material 104B in such a manner that the tip end sides of the leads 102*b* of the lead frame 102 are exposed. Here, the insulating material 104B is formed to be flush with the upper surfaces of the cooling fins 108*b* on the heat dissipating member 108 side. FIG. 10(*a*) shows a state in which the intermediate module 220A is sealed with the insulating material 104B and the electronic component module 110B is formed.

After the electronic component module 110B is formed, the heat dissipating member 108 is subjected to machining such as slicing or dicing to form the plurality of cooling fins 108*b*. Because the cooling fins 108*b* are formed after the intermediate module 220A has been sealed with the insulating material 104B, the insulating material 104B is prevented from flowing between the cooling fins 108*b* while the electronic component module 110B is sealed with the insulating material 104B.

Thereafter, the waterproof film 109 is formed on the outer surfaces of the electronic component module 110B in accordance with the method described in the first embodiment.

In other respects, the configuration of the waterproof electronic device 100B is the same as that in the first embodiment. Members corresponding to those in the first embodiment are denoted by the same reference numerals and the explanation thereof will be omitted.

Also in the third embodiment, the waterproof film 109 may be formed on the upper surface 110*a* of the electronic component module 110B in such a manner that the waterproof film 109 is not in contact with the leads 102*b*, as shown in FIG. 6.

The structure of the heat dissipating module 230A shown in FIG. 7(*b*) or the heat dissipating module 230B shown in FIG. 7(*c*) may be employed.

Therefore, the same effects as those in the first embodiment can be obtained also in the third embodiment.

Furthermore, the strength can be increased with the insulating material 104B.

Fourth Embodiment

Figure 11:
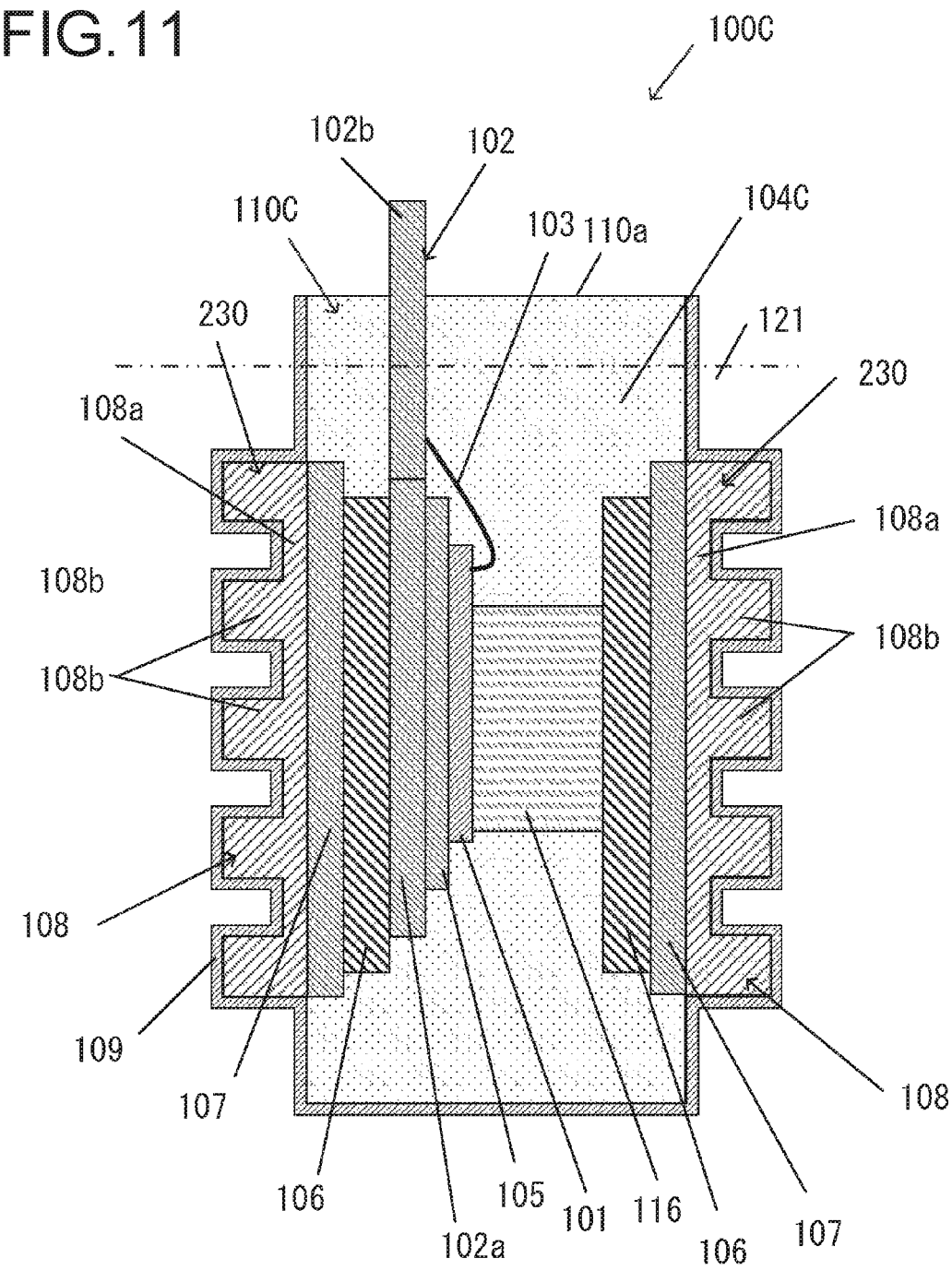
FIG. 11 is a cross-sectional view of a waterproof electronic device showing a fourth embodiment of the present invention.

FIG. 11 is a cross-sectional view of a waterproof electronic device 100C according to a fourth embodiment of the present invention.

The waterproof electronic device 100C in the fourth embodiment is different from that in the first embodiment in that the waterproof type electronic device 100C includes a heat dissipating module (an opposite heat dissipating module) 230 also on the opposite side surface of the intermediate module 220. This difference will be mainly described below for the waterproof electronic device 100C.

As explained in the first embodiment, the back surface of the electronic component 101 is die-bonded to the die 102*a* of the lead frame 102 with the joining material 105 and the electrodes (not shown) on the main surface side are bonded to the respective leads 102*b* with the wires 103. The lead frame 102 is joined to the heat dissipating module 230 constructed of the heat dissipating member 108, the intermediate heat transfer member 107, and the insulating member 106 which are integrally joined.

The electrodes (not shown) provided on the main surface of the electronic component 101 are arranged along the periphery of the electronic component 101, and one surface of an intermediate heat transfer body 116 is joined to the center part of the electronic component 101. The intermediate heat transfer body 116 is made of a metal with a high thermal conductivity such as copper or aluminum, or a ceramic such as alumina. The other surface of the intermediate heat transfer body 116 is joined to a heat dissipating module 230 constructed of the heat dissipating member 108, the intermediate heat transfer member 107, and the insulating member 106 which are integrally joined.

The heat dissipating modules 230 that are arranged as a pair on opposite side surfaces have basically the same structure and have the same configuration of the heat dissipating member 108, the intermediate heat transfer member 107, and the insulating member 106. It will be noted that the heat dissipating module 230 provided on the main surface side of the electronic component 101 may have a structure having no insulating member 106, as long as the structure ensures insulation on the main surface side of the electronic component 101. Furthermore, the area and/or shape of members that constitute a pair of heat dissipating modules 230 may be different from each other as appropriate.

In the waterproof electronic device 100C according to the fourth embodiment, the heat dissipating members 108 of the pair of heat dissipating modules 230 are exposed on a pair of opposite surfaces of the electronic component module 110C having a generally rectangular parallelepiped shape in outer appearance, while the insulating material 104C is exposed on other four surfaces. The waterproof film 109 is formed on the peripheral side surface and bottom surface of the electronic component module 110C as in the first embodiment. In this way, the waterproof electronic device 100C is formed.

In other respects, the configuration of the waterproof electronic device 100C is the same as that in the first embodiment. Members corresponding to those in the first embodiment are denoted by the same reference numerals and the explanation thereof will be omitted.

It will be noted that also in the fourth embodiment, the waterproof film 109 may be formed on the upper surface 110a of the electronic component module 110C in such a manner that the waterproof film 109 is not in contact with the leads 102b, as in the first embodiment.

Moreover, the structure of the unprocessed heat dissipating module 240 and the manufacturing method for forming the unprocessed heat dissipating module 240 shown in FIGS. 4(a) to 4(c) may be applied. Furthermore, the structure of the heat dissipating module 230A shown in FIG. 7(a) or the heat dissipating module 230B shown in FIG. 7(b) may be employed.

Therefore, the same effects as those in the first embodiment can be obtained also in the fourth embodiment.

Fifth Embodiment

Figure 12:
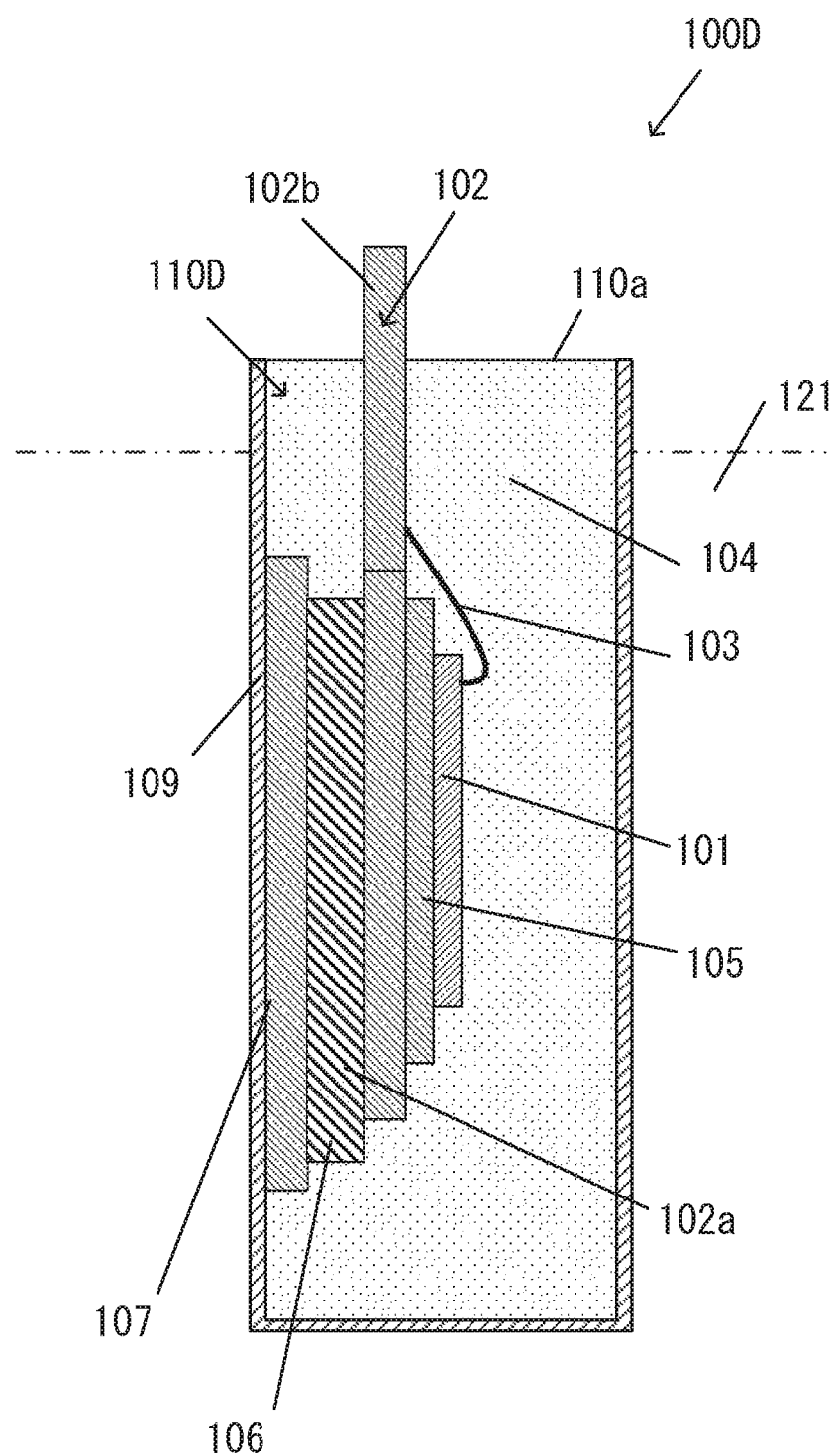
FIG. 12 is a cross-sectional view of a waterproof electronic device showing a fifth embodiment of the present invention.

FIG. 12 is a cross-sectional view of a waterproof electronic device 100D according to a fifth embodiment of the present invention.

The waterproof electronic device 100D in the fifth embodiment is different from the waterproof electronic devices 100, 100A to 100C in the first to fourth embodiments in that the waterproof electronic device 100D has a structure with no heat dissipating member 108.

In other words, in the waterproof electronic device 100D, an electronic component module 110D has a structure in which the lead frame 102 is joined onto the insulating member 106 which in turn is joined to the intermediate heat transfer member 107 and the electronic component 101 is die-bonded onto the lead frame 102. The electronic component module 110D has a generally rectangular parallelepiped shape with the insulating material 104 surrounding the electronic component 101, and the waterproof film 109 is formed on all surfaces, except for the upper surface 110a of the electronic component module 110D. The waterproof film 109 may be formed on the upper surface 110a of the electronic component module 110D in such a manner that the waterproof film 109 is not in contact with the leads 102b.

In the waterproof type electronic device 100D in the fifth embodiment, the intermediate heat transfer member 107 has the same function as that of the heat dissipating member 108 in other embodiments. Although this member is here represented by the intermediate heat transfer member 107 to show the correspondence between this embodiment and other embodiments, this member is essentially a surface heat dissipating member that is directly cooled by the coolant 121. The area of the intermediate heat transfer member 107, i.e., the surface heat dissipating member may be equal to or larger than the total surface area of the cooling fins 108b.

In other respects, the configuration of the waterproof electronic device 100D is the same as that in the first embodiment. Members corresponding to those in the first embodiment are denoted by the same reference numerals and the explanation thereof will be omitted.

Also in the fifth embodiment, there is no metal case accommodating the whole electronic component module 110D. Therefore, a reduction in material cost and an improvement in productivity can be achieved.

In particular, because the waterproof electronic device 100D in the fifth embodiment has a more simplified structure with no heat dissipating member 108, an additional reduction in material cost and a further improvement in productivity can be achieved to a larger degree.

(Method for Forming Waterproof Film 109)

Figure 13A:
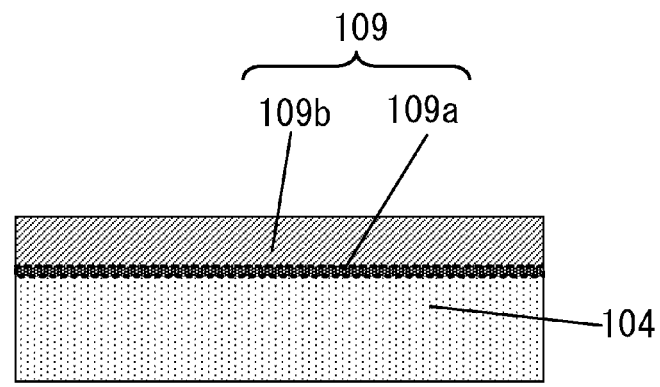
FIGS. 13A-13C are schematic cross-sectional views showing one example of methods for forming a waterproof film.

Although a method for forming the waterproof film 109 has been described above, the method will be described again referring to FIG. 13(a).

A power supply thin film 109a is formed on one surface of the insulating material 104 by one of sputtering, vapor deposition, electroless plating, cold spraying, thermal spraying, aerosol deposition, or electrically conductive polymer film formation as describe above. A thick film 109b is formed on the power supply thin film 109a by electroplating with copper, nickel, tin, zinc, or an alloy including one or more of them, for example.

In this way, the waterproof film 109 can be formed by a combination of the power supply thin film formation and the thick film formation.

However, when the waterproof film 109 is formed by the above-described method, plating defects such as pinholes can occur on the surface of the thick film 109b. The plating defects such as pinholes reduce the corrosion resistance.

Figure 13B:
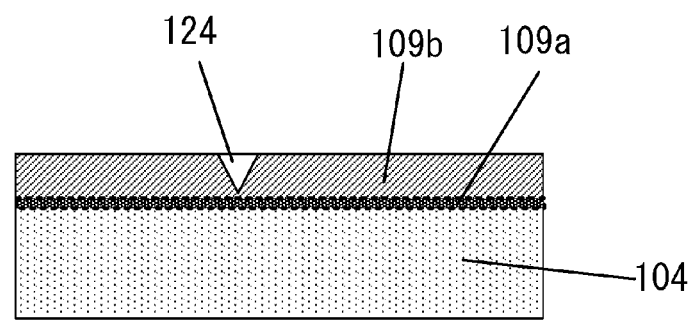
Figure 13C:
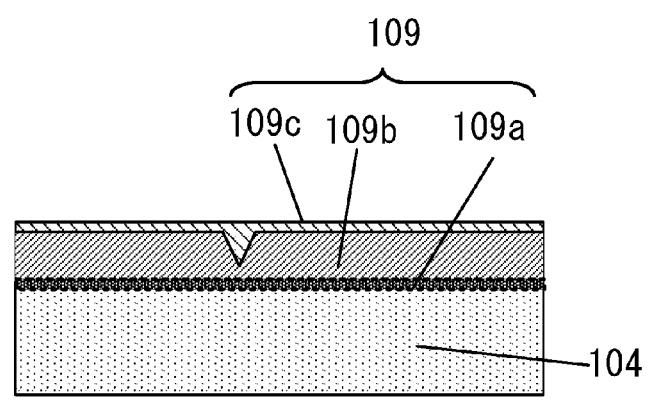

Referring to FIGS. 13(b) and 13(c), a method for producing a high corrosion resistant and reliable plating having no plating defects will be described.

The power supply thin film 109a is formed on one surface of the insulating material 104 by the above-described method. The thick film 109b is formed on the power supply thin film 109a by nickel electroplating with a sulfamine bath (a first electroplating step). It is known that in the nickel electroplating with the sulfamine bath, an internal stress of a precipitated film is small. However, in this electroplating, plating defects such as a pinhole 124 can occur as shown in FIG. 13(b).

A top film 109c is formed on the thick film 109b by electroplating with a Watts bath (a second electroplating step). In the nickel electroplating with the Watts bath, a precipitated film has a fine crystal structure and has a high corrosion resistance. In addition. Adding a brightener provides a leveling effect, that is, a plating defect part such as a pinhole 124 is filled with the brightener to make the surface smooth.

Thus, the high corrosion resistant waterproof film 109 is formed in which the top film 109c having a planar surface is formed on the thick film 109b, as shown in FIG. 13(c).

If the thick film 109b is exposed to the atmosphere in forming the top film 109c on the thick film 109b, an oxidation film is formed on the surface of the thick film 109b. The oxidation film inhibits growth of plating in forming the top film 109c. Therefore, after the thick film 109b has been formed, the thick film 109b is preferably transferred as it is to form the top film 109c thereon, without making the surface of thick film 109b dry.

In forming the top film 109c, if the precipitation of the film is not good, a power supply thin film may be formed on the surface of the thick film 109b and the top film 109c may be formed on the power supply thin film.

It is also possible that metal particulates improving the corrosion resistance, such as Cr, Mo, W, or Ti, are precipitated together in forming the nickel electroplating film.

As explained above, in the structures according to the above embodiments, sealing with the insulating material 104 is performed in such a manner that the surface of the heat dissipating member 108 (or the intermediate heat transfer member 107) is exposed to the outside, and regions of the insulating material 104 that are to be immersed in the coolant, i.e., regions where the insulating material 104 is contact with the coolant are covered with the waterproof film 109.

Hence, the waterproof electronic device 100, 100A to 100D in each embodiment has no metal case for accommodating the electronic component module 110, 110A to 110D. Furthermore, the structure of the electronic component module 110, 110A to 110D is simple.

Therefore, effects of reducing the material cost and improving the productivity can be obtained.

It will be noted that each of the embodiments described above illustrates the structure in which the waterproof film 109 is formed on all surfaces, except for the upper surface 110a of the electronic component module 110, 110A to 110D. However, it is only necessary to provide the waterproof film 109 at least on regions of the surface of the electronic component module that are to be immersed in the coolant 121. Therefore, the waterproof film 109 may not be formed on surface regions other than the regions that are to be immersed in the coolant 121.

Furthermore, the electronic component 101 may include not only semiconductor elements, but also passive components, or sensors for detecting physical amounts such as temperature, flow rate, or pressure.

Furthermore, parts of the embodiments described above may be combined or modified within the scope of the present invention. What is needed is that the heat dissipating member is joined to the electronic component in a thermally conductive manner; the electronic component module is constructed in which the electronic component is sealed with the insulating material in such a manner that one surface of the heat dissipating member is exposed; and the waterproof film is formed at least on regions of the electronic component module that are to be immersed in the coolant.

The disclosure of the following priority application is herein incorporated by reference:

Japanese Patent Application No. 2014-33952 (filed Feb. 25, 2014)

REFERENCE SIGNS LIST 100, 100A to 100D waterproof electronic device
101 electronic component
102, 102A lead frame
102a die
102b lead
103 wire
104, 104A, 104B, 104C insulating material
105 joining material
106 insulating member
107, 107A intermediate heat transfer member
108 heat dissipating member
108b cooling fin
109 waterproof film
109a power supply thin film
109b thick film
109c top film
110, 110A to 110D electronic component module
110a upper surface
110b lower surface
116 intermediate heat transfer body
121 coolant
207 low melting point metal material
208 high thermal conductivity material
209 high thermal conductivity/low melting point metal composite material
220, 220A intermediate module
230, 230A, 230B heat dissipating module
240 unprocessed heat dissipating module

The invention claimed is:

1. A waterproof electronic device prepared by a process comprising:
    mounting an electronic component including a semiconductor element on a lead frame and bonding electrodes of the semiconductor element and leads of the lead frame;
    providing a heat dissipating member on the lead frame in a thermally conductive manner;
    forming an electronic component module by covering the electronic component and the heat dissipating member with an insulating material in such a manner that a part of the leads of the lead frame extends to outside; and
    forming a waterproof film on an outer surface of the heat dissipating member of the electronic component module and at least parts of the insulating material around the heat dissipating member, wherein
        the electronic component module includes an insulating member and an intermediate heat transfer member that are arranged between the lead frame and the heat dissipating member; and
        forming the electronic component module includes a step for putting metal powders in a mold and injecting a molten metal material having a lower melting point and lower thermal conductivity than that of the metal powders into a gap between the insulating member and the mold to form the intermediate heat transfer member and the heat dissipating member.

2. The waterproof electronic device according to claim 1, wherein:
    the heat dissipating member has a plurality of cooling fins and the waterproof film is formed to cover surfaces of the cooling fins.

3. The waterproof electronic device according to claim 1, wherein:
    the waterproof film is made of a metal material.

4. The waterproof electronic device according to claim 1, wherein:
    the waterproof film is made of a metal material having a smaller ionization tendency than that of hydrogen, or a metal material having a surface on which an oxidation film is formed.

5. The waterproof electronic device according to claim 1, wherein:
    the intermediate heat transfer member has a larger area than that of the heat dissipating member.

6. The waterproof electronic device according to claim 1, wherein:
    the insulating member has a smaller area than those of the intermediate heat transfer member and the heat dissipating member.

7. The waterproof electronic device according to claim 1, wherein:

the heat dissipating member has a plurality of cooling fins; and the insulating material is formed to be generally flush with upper surfaces of the cooling fins.

8. The waterproof electronic device according to claim 1, wherein:

the insulating material is made of an epoxy resin or a material containing an epoxy resin and a filler mixed in the epoxy resin, the filler being made of a material having a larger thermal conductivity than that of silica.

9. A method for manufacturing a waterproof electronic device, comprising:

mounting an electronic component including a semiconductor element on a lead frame and bonding electrodes of the semiconductor element and leads of the lead frame;

providing a heat dissipating member on the lead frame in a thermally conductive manner;

forming an electronic component module by covering the electronic component and the heat dissipating member with an insulating material in such a manner that a part of the leads of the lead frame extends to outside; and forming a waterproof film on an outer surface of the heat dissipating member of the electronic component module and at least parts of the insulating material around the heat dissipating member, wherein the electronic component module includes an insulating member and an intermediate heat transfer member that are arranged between the lead frame and the heat dissipating member; and forming the electronic component module includes a step for putting metal powders in a mold and injecting a molten metal material having a lower melting point and lower thermal conductivity than that of the metal powders into a gap between the insulating member and the mold to form the intermediate heat transfer member and the heat dissipating member.

10. The method for manufacturing the waterproof electronic device according to claim 9, wherein:

forming the waterproof film includes a first electroplating step for forming a first metal film layer and a second electroplating step for forming a second metal film layer that smoothes irregularities in a surface of the first metal film layer.

* * * * *